(12) United States Patent
Clavette (10) Patent No.: US 11,071,206 B2
(45) Date of Patent: Jul. 20, 2021

(54) ELECTRONIC SYSTEM AND PROCESSOR SUBSTRATE HAVING AN EMBEDDED POWER DEVICE MODULE

(71) Applicant: Infineon Technologies Austria AG, Villach (AT)

(72) Inventor: Danny Clavette, Greene, RI (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/655,303

(22) Filed: Oct. 17, 2019

(65) Prior Publication Data

US 2021/0120675 A1 Apr. 22, 2021

(51) Int. Cl.
  *H05K 1/18* (2006.01)
  *H05K 1/14* (2006.01)
  *H05K 1/16* (2006.01)
  *H05K 1/05* (2006.01)

(52) U.S. Cl.
  CPC ............. *H05K 1/188* (2013.01); *H05K 1/056* (2013.01); *H05K 1/162* (2013.01); *H05K 1/165* (2013.01); *H05K 2201/0221* (2013.01)

(58) Field of Classification Search
  CPC ........... H05K 1/056; H05K 1/181–188; H05K 1/14–145; H05K 1/162; H05K 1/165
  See application file for complete search history.

(56) References Cited

U.S. PATENT DOCUMENTS

| | | | |
|---|---|---|---|
| 10,128,035 B2 | 11/2018 | Yao et al. | |
| 10,367,415 B1 | 7/2019 | Sturcken et al. | |
| 2003/0128017 A1 | 7/2003 | Kumar et al. | |
| 2004/0188811 A1 | 9/2004 | Vandentop et al. | |
| 2005/0207133 A1 | 9/2005 | Pavier et al. | |
| 2007/0013080 A1 | 1/2007 | Dibene et al. | |
| 2007/0249092 A1 | 10/2007 | Joshi et al. | |
| 2007/0279882 A1 | 12/2007 | Weir et al. | |
| 2010/0188184 A1 | 7/2010 | Chen | |
| 2011/0234196 A1 | 9/2011 | Chiba | |
| 2013/0075932 A1* | 3/2013 | Schwarzer | H01L 23/49827 257/774 |

(Continued)

FOREIGN PATENT DOCUMENTS

EP 3007223 4/2016

*Primary Examiner* — Hoa C Nguyen
(74) *Attorney, Agent, or Firm* — Murphy, Bilak & Homiller, PLLC (57) ABSTRACT

A processor substrate includes: an electrically insulating material having a first main side and a second main side opposite the first main side; a plurality of electrically conductive structures embedded in the electrically insulating material and configured to provide an electrical interface for a processor at the first main side of the electrically insulating material and to provide electrical connections from the electrical interface to the second main side of the electrically insulating material; and a power device module embedded in the electrically insulating material and configured to convert a voltage provided at the second main side of the electrically insulating material and which exceeds a voltage limit of the processor substrate to a voltage that is within an operating range of the processor and below the voltage limit of the processor substrate. An electronic system that includes the processor substrate is also described.

20 Claims, 6 Drawing Sheets

(56) References Cited

U.S. PATENT DOCUMENTS

| | | |
|---|---|---|
| 2014/0367828 A1 | 12/2014 | Colonna et al. |
| 2015/0049533 A1 | 2/2015 | Nishikimi et al. |
| 2015/0171065 A1 | 6/2015 | Guzek et al. |
| 2015/0380061 A1 | 12/2015 | Matsumoto et al. |
| 2016/0128197 A1 | 5/2016 | Standing et al. |
| 2016/0349288 A1 | 12/2016 | Barnette et al. |
| 2016/0351478 A1* | 12/2016 | Lai ................. H01L 23/3114 |
| 2016/0365304 A1 | 12/2016 | Cho et al. |
| 2016/0381823 A1* | 12/2016 | Ye ........................ H05K 1/181 |
| | | 361/736 |
| 2017/0237339 A1* | 8/2017 | Young ...................... H02M 7/10 |
| | | 363/126 |
| 2017/0302151 A1 | 10/2017 | Snook et al. |
| 2019/0273073 A1 | 9/2019 | Murtuza et al. |
| 2020/0075541 A1 | 3/2020 | Sturcken et al. |

\* cited by examiner

ELECTRONIC SYSTEM AND PROCESSOR SUBSTRATE HAVING AN EMBEDDED POWER DEVICE MODULE

BACKGROUND

Many types of electronic systems include one or more processors attached to a circuit board such as a printed circuit board (PCB), memory which can be volatile and/or non-volatile, and a power converter for converting a high input voltage applied to the board to one or more lower voltages suitable for powering the processor and memory. Processors include but are not limited to central processing units (CPUs), microprocessors, graphics processing units (GPUs), digital signal processors (DSPs), artificial intelligence (AI) accelerators, image processors, network or packet processors, coprocessors, multi-core processors, front-end processors, baseband processors, etc.

Ideally, power is conveyed across the circuit board of the electronic system from the power converter to the processor and memory with as high a voltage as possible to minimize current and therefore reduce $I^2R$ power losses. However, processors are typically placed on a separate substrate through which connections between the processor and the circuit board are achieved. Many types of processor substrates are designed with minimum capacitance between layers to enable high performance, e.g., in the GHz range, have a low breakdown voltage. As such, many types of conventional processor substrates cannot tolerate relatively high voltages. For example, some conventional processor substrates have a maximum breakdown voltage of 2.5 V or even lower, whereas the input voltage to the circuit board of an electronic system is much higher, e.g., typically 48 V.

Thus, there is a need for an improved processor substrate design which can withstand higher voltages so that power may be conveyed across a circuit board of an electronic system with a higher voltage and lower current to reduce $I^2R$ power losses.

SUMMARY

According to an embodiment of an electronic system, the electronic system comprises: a board; a power converter attached to the board and configured to convert an input voltage applied to the board to an intermediate voltage; and a processor attached to a substrate, wherein the substrate is attached to the board or seated in a socket attached to the board, wherein the substrate comprises: an electrically insulating material having a first main side facing the processor and a second main side facing the board; a plurality of electrically conductive structures embedded in the electrically insulating material and configured to provide an electrical interface between the processor and the board if the substrate is attached to the board, or between the processor and the socket if the substrate is seated in the socket; and a power device module embedded in the electrically insulating material and configured to convert the intermediate voltage at the second main side to a voltage that is within an operating range of the processor and below a voltage limit of the substrate.

According to an embodiment of a processor substrate, the processor substrate comprises: an electrically insulating material having a first main side and a second main side opposite the first main side; a plurality of electrically conductive structures embedded in the electrically insulating material and configured to provide an electrical interface for a processor at the first main side of the electrically insulating material and to provide electrical connections from the electrical interface to the second main side of the electrically insulating material; and a power device module embedded in the electrically insulating material and configured to convert a voltage provided at the second main side of the electrically insulating material and which exceeds a voltage limit of the processor substrate to a voltage that is within an operating range of the processor and below the voltage limit of the processor substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described provide a processor substrate in which a power device module is embedded in an electrically insulating material of the substrate and configured to convert a voltage provided at a front or back side of the electrically insulating material and which exceeds a voltage limit of the processor substrate to a voltage that is within an operating range of a processor attached to the substrate and below the voltage limit of the processor substrate. This way, the processor substrate may still use low voltage breakdown materials. With such a processor substrate, power may be conveyed across a circuit board of an electronic system with a higher voltage and lower current to reduce $I^2R$ power losses.

The term "power device module" as used herein means a packaged functional assembly that includes at least one power switch used in converting a voltage from one level to another level, e.g., as is done in power conversion and voltage regulation. The power device module may also include a driver circuit for driving the at least one power switch. The power device module may additionally include a controller for controlling the driver circuit so as to implement a power converter or a voltage regulator (VR). The controller and/or driver functionality may instead be implemented outside the power device module. For example, a processor attached to the substrate in which the power device module is embedded may provide the VR control functionality to the power device module, thereby eliminating the need for a separate VR controller. The driver circuit for the at least one power switch included in the power device module also may be outside the power device module. Various passive components such as capacitors and/or inductors that make up the power converter or voltage regulator may be included in the power device module, surface mounted to the power device module, located on a separate board, etc. Described next in more detail are various embodiments of the power device module and an electronic system that includes the power device module.

Figure 1A:
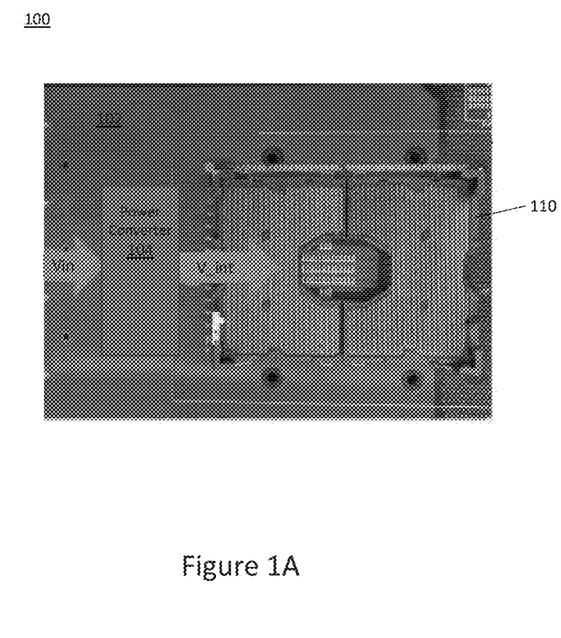
FIGS. 1A through 1D illustrate different views of an embodiment of an electronic system that includes a board, a power converter attached to the system board, and a processor attached to a substrate with a power device module embedded in the processor substrate.
Figure 1B:
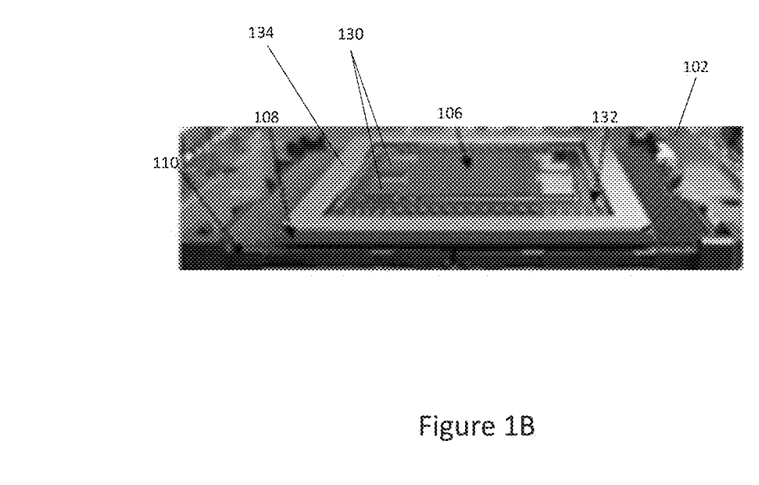

FIG. 1A illustrates an embodiment of an electronic system 100 that includes a board 102 such as a PCB, a power converter 104 attached to the system board 102, and a processor 106 attached to a substrate 108. FIG. 1B shows a partial perspective view of the processor 106 attached to the substrate 108 and the processor substrate 108 seated in a socket 110 which is attached to the system board 102. The processor substrate 108 may instead by attached to the system board 102 without the intervening socket 110, or the processor substrate 108 may be attached to an interposer (not shown) such as another board, laminate, etc. which is seated in the socket 110 or attached to the system board 102.

The term "processor" as used herein means an electronic circuit which performs operations on an external data source such as memory or some other data stream. The term "processor" as used herein includes CPUs, microprocessors, GPUs, DSPs, AI accelerators, image processors, network or packet processors, coprocessors, multi-core processors, front-end processors, baseband processors, etc. The type of processor 106 depends on the electronic system 100. For example, in the case of a computer, server, mobile device, etc., the processor 106 may be a CPU, a microprocessor, a coprocessor, a multi-core processor, a front-end processor, etc. In the case of a network interface that manages radio functions of a wireless network, the processor 106 may be a baseband processor. In the case of a graphics card, the processor 106 may be a GPU or an image processor. In the case of a network interface card, the processor 106 may be a network or packet processor. These are just some examples of electronic systems and should not be considered limiting.

In each case, the power converter 104 attached to the board 102 of the electronic system 100 is configured to convert an input voltage Vin applied to the board 102 to an intermediate voltage V_int lower than the input voltage Vin. For example, the input voltage Vin applied to the system board 102 may be 48V or 12V and the intermediate voltage V_int output by the power converter 104 may be 6V. These input and intermediate voltage values are only given as an example and should not be considered limiting. What does matter is that both the input voltage Vin applied to the system board 102 and the intermediate voltage V_int output by the power converter 104 are higher than a voltage limit such as a breakdown voltage of the processor substrate 108 and the operating voltage range of the processor 106. Accordingly, power may be conveyed across the system board 102 at a higher voltage (V_int) and lower current to reduce $I^2R$ power losses.

Figure 1C:
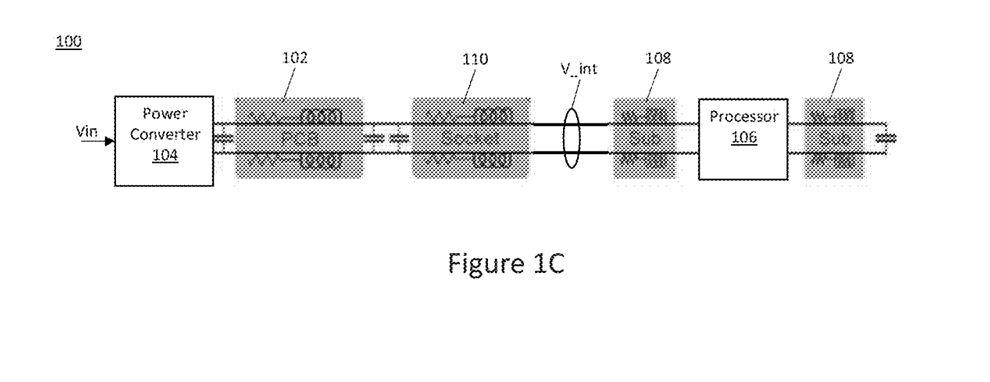

FIG. 1C illustrates an equivalent circuit diagram for the electronic system 100 shown in FIG. 1A. The equivalent circuit diagram shows resistive and inductive parasitic elements associated with the components of the electronic system 100 which effect $I^2R$ power loss across the system board 102. By setting the intermediate voltage V_int output by the power converter 104 attached to the system board 102 above the voltage limit of the processor substrate 108, the $I^2R$ power loss between the power converter 104 and the processor substrate 108 are reduced substantially. Instead of outputting the processor supply voltage, e.g., 1V, the intermediate voltage V_int output by the power converter 104 is instead higher, e.g., 6V. In this example, which should not be considered limiting, the current carried by the system board 102 between the power converter 104 and the processor substrate 108 is reduced by 6X and the $I^2R$ power loss reduced by 36X. More or less $I^2R$ power loss reduction may be realized by selecting an appropriate level of the power converter output V_int.

Figure 1D:
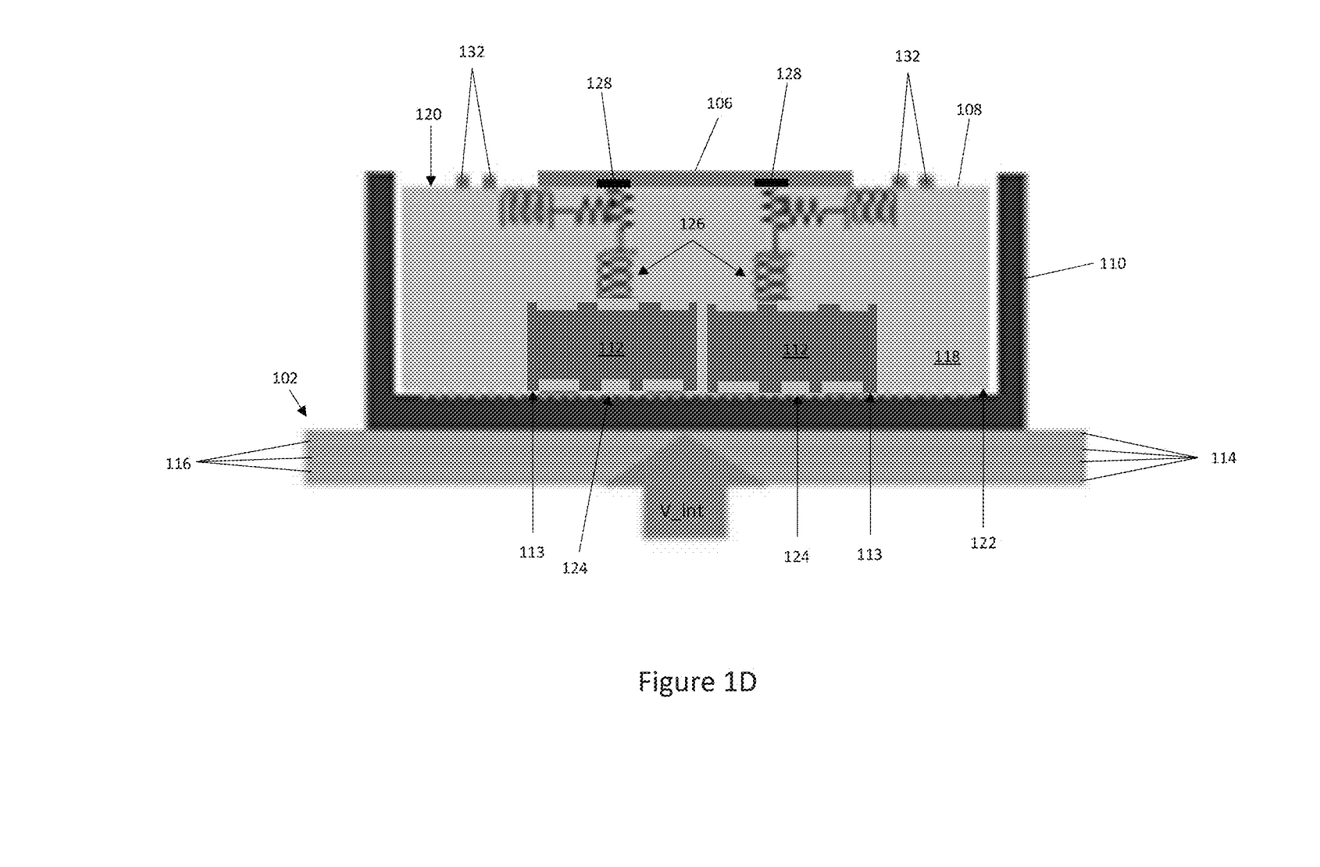

To ensure the processor substrate 108 is not damaged by the voltage V_int output by the power converter 108, at least one power device module 112 is embedded in the processor substrate 108, as shown in the partial cross-sectional view of FIG. 1D. Each power device module 112 converts the intermediate voltage V_int at the bottom side of the processor substrate 108 to a voltage that is within the operating range of the processor 106 and below the voltage limit of the processor substrate 108. More than one power device module 112 is shown embedded in the processor substrate 108 in FIG. 1D, e.g., in the case of a multi-phase voltage regulator where each power device module 112 implements one phase of the voltage regulator. A single power device module 112 instead may be embedded in the processor substrate 108.

As shown in FIG. 1D, the system board 102 may be a PCB having conductive tracks, pads and other features etched from one or more sheet layers 114 of copper laminated onto and/or between sheet layers 116 of a non-conductive substrate. The processor substrate 108 includes an electrically insulating material 118 having a first main 120 side facing the processor and a second main side 122 facing the system board 102. Each power device module 112 is embedded in the electrically insulating material 118 of the processor substrate 108 and converts an intermediate voltage V_int at the second main side 122 of the processor substrate 108 to a voltage that is within the operating range of the processor 106 and below the voltage limit of the processor substrate 108, in particular that of the insulating material 118.

Each power device module 112 is not covered by the electrically insulating material 118 of the processor substrate 108 at the second main side 122 of the processor substrate 108 which faces the system board 102. This way, no part of the electrically insulating material 118 is exposed to the full intermediate voltage V_int input to the power device module(s) 112 at the second main side 122 of the processor substrate 108. This allows for the use of low breakdown voltage materials as the electrically insulating material 118 of the processor substrate 108.

The bottom side 113 of each power device module 112 may be coplanar with the second main side 122 of the processor substrate 108 as shown in FIG. 1D. In another embodiment, the bottom side 113 of each power device module 112 may lie in a plane below the second main side 122 of the processor substrate 108 so that the power device module(s) 112 protrude beyond the second main side 122 of the processor substrate 108. In yet another embodiment, the bottom side 113 of each power device module 112 may lie in a plane above the second main side 122 of the processor substrate 108 so that each power device module 112 terminates short of the second main side 122 of the processor substrate 108.

Electrically conductive structures embedded in the electrically insulating material 118 of the processor substrate 108 provide an electrical interface between the processor 106 and the system board 102 if the processor substrate 108 is attached to the system board 102, or between the processor 106 and a socket 110 if the processor substrate 108 is seated in a socket 110 attached to the system board 102. The electrically conductive structures are illustrated as inductive and resistive elements in FIG. 1D, and the electrically conductive structures depends on the type of processor substrate employed and corresponding fabrication process. In one embodiment, the power device module 112 is vertically aligned with the processer 106 and a primary current path between the system board 102, the socket 110, the processor substrate 108 and the processor 106 is a vertical path which includes the power device module 114.

Standard substrate processing may be used to embed each power device module 112 in the processor substrate 108. For example, the processor substrate 108 may be a laminate substrate with one or more layers of dielectric material as the electrically insulating material 118 and one or more layers of metal traces, electrically conductive vias, etc. as the electrically conductive structures. Each power device module 112 may be placed in or surrounded by a first layer of the dielectric material 118, e.g., by depositing or growing the dielectric material 118 of the processor substrate 108 around the power device module 112. The upper layer(s) of the dielectric material 118 of the processor substrate 108 are then manufactured, e.g., according to a known process. In one embodiment, the electrically insulating material 118 of the processor substrate 108 is an organic material having a relatively low dielectric constant compared to other typical laminate materials such as FR4.

The electrically conductive structures of the processor substrate 108 include input connections 124 which electrically connect the intermediate voltage V_int at the second main side 122 of the processor substrate 108 to an input of a corresponding power device module 112 embedded in the processor substrate 108, and output connections 126 which electrically connect the respective output of each power device module 112 to corresponding power terminals 128 of the processor 106 attached to the first main side 120 of the processor substrate 108. These electrical connections 124, 126 may be realized as part of a standard metallization process employed in the fabrication of processor substrates. Memory 130 and other components such as decoupling capacitors 132, etc. also may be attached to the first main side 120 of the processor substrate 108, e.g., as shown in FIGS. 1B and 1D. A stabilizer 134 such as a metal ring may be placed on the periphery of the first main side 120 of the processor substrate 108 to provide added stability, e.g., also as shown in FIG. 1B.

High frequency signals such as GHz signals may pass through signal I/Os of the processor 106 and/or memory 130, the signal I/Os being out of view in FIGS. 1A through 1D. A large number of high frequency memory I/O signal lines may be provided on the system board 102. Such an arrangement restricts power delivery flow on the system board 102, and complicates the delivery of the necessary power to the processor 106 and memory 130 due to various parasitics such as the ones shown in FIG. 10.

Further complicating power delivery to the processor 106, the processor substrate 108, processor 106 and memory 130 each have voltage limitations which should not be exceeded. By embedding the power device module 112 in the electrically insulating material 118 of the processor substrate 108, the power converter 104 attached to the system board 102 can convert the input voltage Vin applied to the system board 102 to an intermediate voltage V_int that is higher than the voltage limitations of at least the processor substrate 108 and processor 106, and the power device module 112 converts the intermediate voltage V_int at the second main side 122 of the processor substrate 108 to a safe voltage level that is within the operating range of the processor 106 and below the voltage limit of the processor substrate 106. Described next are additional power device module embodiments, any of which may be used in the electronic system 100 shown in FIGS. 1A through 1D or other types of electronic systems that have at least one processor mounted to a system board and wherein the input voltage to the system board is higher than the voltage limits of the processor and processor substrate.

Figure 2:
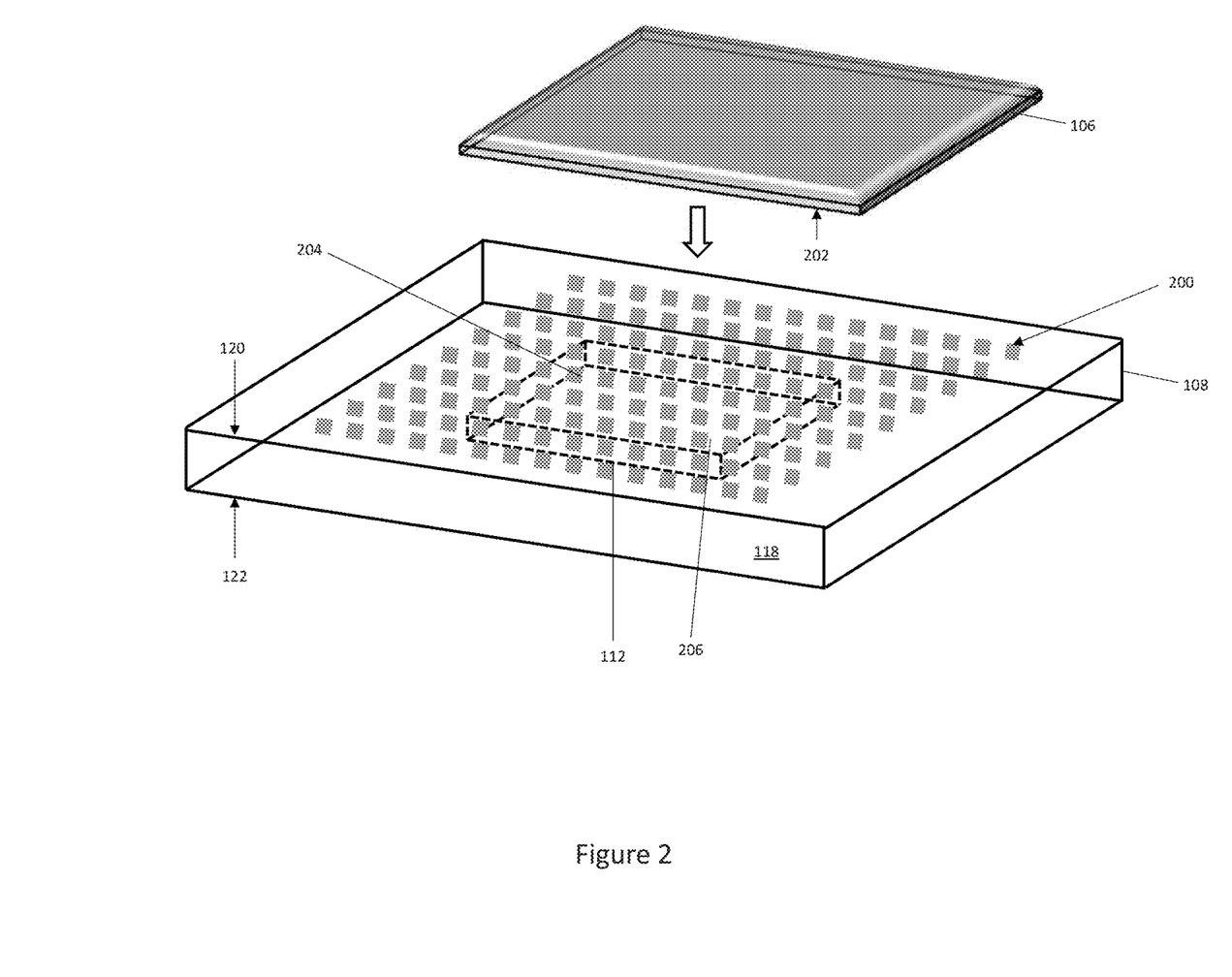
FIG. 2 illustrates a side perspective view of an embodiment of a single power device module embedded in a processor substrate.

FIG. 2 illustrates a side perspective view of a single power device module 112 embedded in a processor substrate 108. The power device module 112 is shown as a dashed box in FIG. 2 to indicate that the power device module 112 is embedded within the electrically insulating material 118 of the processor substrate 108. The processor 106 is attached to the substrate 108 in the direction indicated by the downward facing arrow in FIG. 2.

As previously described herein, electrically conductive structures embedded in the electrically insulating material 118 of the processor substrate 108 provide an electrical interface between the processor 106 and a system board if the processor substrate 108 is attached to the system board 102, or between the processor 106 and a socket 110 if the processor substrate 108 is seated in a socket 110 attached to the system board 102. The interface is partly visible in FIG. 2 as terminals 200 such as metal traces, contact pads, pins, solder bumps, Cu pillars, etc., at the first main side 120 of the processor substrate 108.

The processor 106 has corresponding terminals at the mounting side 202 of the processor, for connecting to the terminals 200 at the first main side 120 of the processor substrate 108. The terminals of the processor 106 are out of view in FIG. 2. Other parts of the interface formed by the electrically conductive structures embedded in the electrically insulating material 118 of the processor substrate 108 may include one or more levels of metal traces, wires, etc. embedded in the electrically insulating material 118 and additional terminals at the second main side 122 of the processor substrate 108 and which are out of view in FIG. 2. The terminals at the second main side 122 of the processor substrate 108 contact corresponding terminals of a socket 110 attached to the system board 102, an interposer, or the system board 102 itself.

In one embodiment, the driver circuit for the at least one at least one power switch included in the power device module 112 also is embedded in the processor substrate 108 and the electrical interface provided by the processor substrate 108 includes a first connection 204 for receiving a switching control signal from the processor 106 for controlling the driver circuit included in the power device module 112, and one or more second connections 206 for providing telemetry data such a current information, temperature information, etc. from the power device module 112 to the processor 106. According to this embodiment, the processor 106 attached to the substrate 108 in which the power device module 112 is embedded provides the power conversion or voltage regulation control functionality to the power device module 112, thereby eliminating the need for a separate controller.

Figure 3:
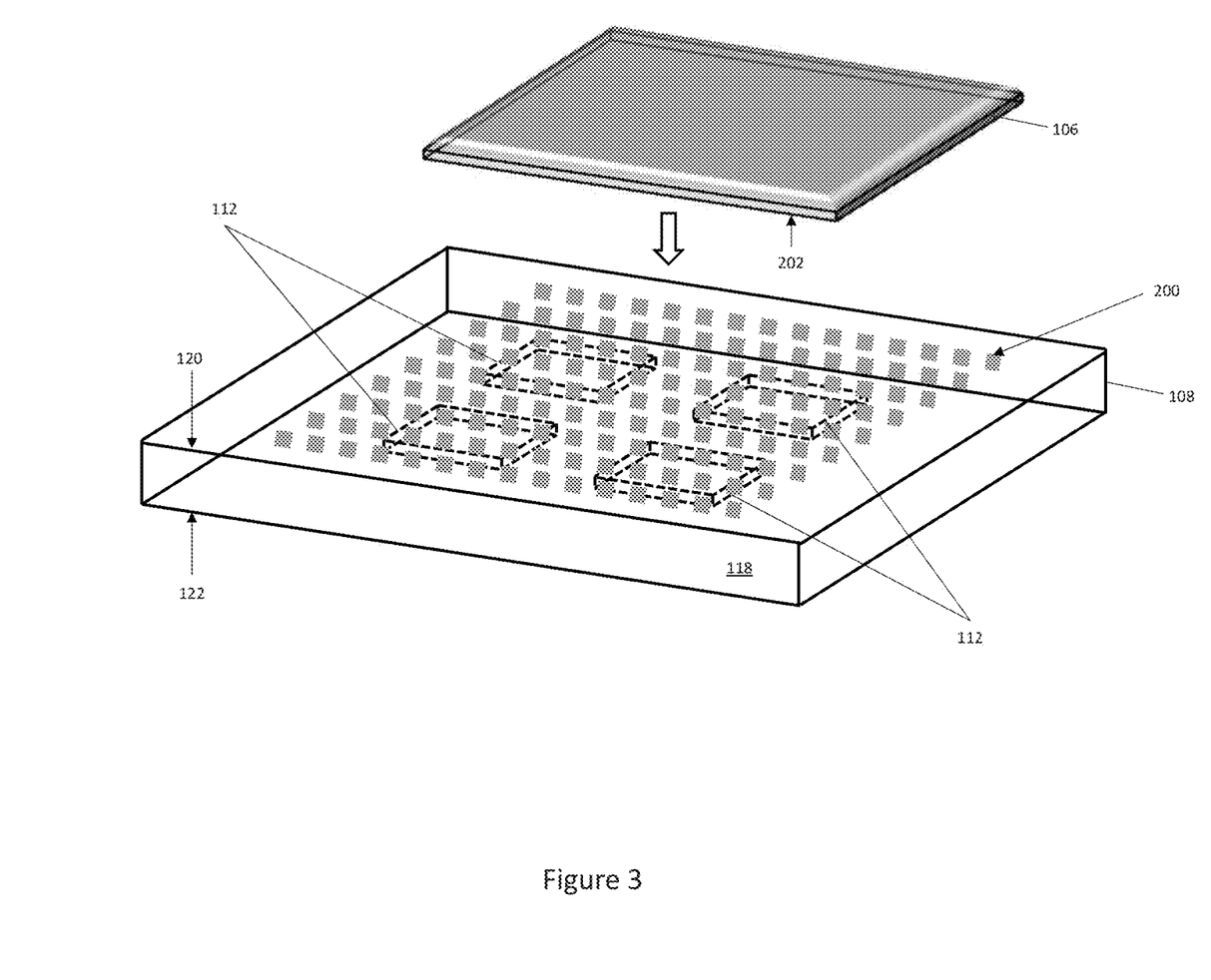
FIG. 3 illustrates a side perspective view of an embodiment of multiple power device modules embedded in a processor substrate.

FIG. 3 illustrates a side perspective view of multiple power device modules 112 embedded in the processor substrate 108, according to an embodiment. In this embodiment, the power device modules 112 are shown as individual dashed boxes in FIG. 3 to indicate that the power device modules 112 are embedded within the electrically insulating material 118 of the processor substrate 108. The embodiment shown in FIG. 3 is similar to the embodiment shown in FIG. 2. Different, however, more than one power device module 112 is embedded in the processor substrate 108. Each power device module 112 may be a separate power stage of a power converter or voltage regulator, or each power device module 112 may be a complete power converter or voltage regulator so that multiple power converters or voltage regulators are embedded in the same processor substrate 108. Multiple power converters or voltage regulators embedded in the same processor substrate 108 may be of particular interest if more than one processor 106 is attached to the same substrate 108 and/or if one or memory modules with a different operating voltage range than the processor(s) 106 are also attached to the substrate 108.

As previously described herein, each power device module 112 is a packaged functional assembly that includes at least one power switch used in converting the intermediate voltage V_int output by the power converter 104 attached to the system board 102 to a voltage that is within the operating range of the processor 106 and below the voltage limit of the processor substrate 108. Each power device module 112 is packaged in that the module 112 has an enclosure such as a molded plastic or resin body, laminate structure, etc. in which at least one power switch is embedded or enclosed. The power device module 112 may also include a driver circuit for driving the at least one power switch. The power device module may additionally include a controller for controlling the driver circuit so as to implement a power converter or a voltage regulator (VR). The controller and/or driver functionality may instead be implemented outside the power device module. In each case, the power converter or voltage regulator at least partly implemented by the power device module may be any typical power converter or voltage regulator used to supply power to a processor on a system board. For example, the power converter or voltage regulator may be a buck converter, a boost converter, a buck-boost converter, a switched capacitor voltage regulator, etc. Described next in more detail are various embodiments of the power device module 112.

Figure 4:
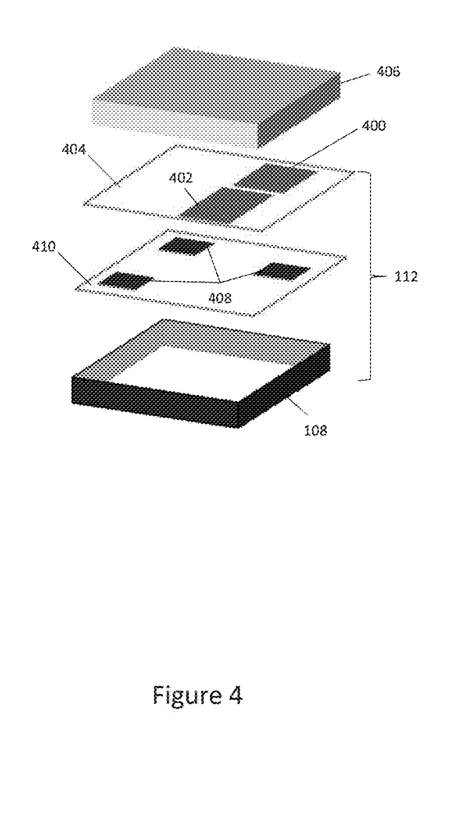
FIGS. 4 through 9 illustrate respective exploded side perspective views of additional embodiments of a power device module embedded in a processor substrate.

FIG. 4 shows an exploded side perspective view of the power device module 112 embedded in the processor substrate 108, according to another embodiment. In this embodiment, the power device module 112 implements a single phase of a power converter or voltage regulator that converts the intermediate voltage V_int output by the power converter 104 attached to the system board 102 to a voltage that is within the operating range of the processor 106 and below the voltage limit of the processor substrate 108. The single phase includes a high-side power transistor chip (die) 400 and a low-side power transistor chip 402 embedded in a layer 404 of the electrically insulating material 118 of the processor substrate 108. The high-side and low-side power transistor chips 400, 402 are shown as being formed in the same layer 406 of the electrically insulating material 118 of the processor substrate 108 in FIG. 4. However, the high-side and low-side power transistor chips 400, 402 instead may be formed in different layers of the electrically insulating material 118 of the processor substrate 108, which also applies to the other power device module embodiments shown in FIGS. 5, 6 and 8 and in which discrete chips are used to implement the high-side and low-side power transistors of the corresponding single-phase or multi-phase power converter/voltage regulator.

In the case of a buck converter, the high-side power transistor chip 400 and the low-side power transistor chip 402 are electrically connected in a half-bridge configuration at a switch node which is electrically connected to an output inductor 408 of the single phase. The output inductor 408 provides a phase current to a load such as a processor or memory. One or more capacitors 410 which form part of the single phase may also be embedded in another layer 412 of the electrically insulating material 118 of the processor substrate 108. The output inductor 408 may be embedded in the processor substrate 108, or may be external to the processor substrate 108 as shown in FIG. 4. The capacitors 410 may also be external to the processor substrate 108. The driver and control circuitry for the power converter or voltage regulator partly implemented by the power module 112 shown in FIG. 4 also is external to the processor substrate 108, according to this embodiment.

Figure 5:
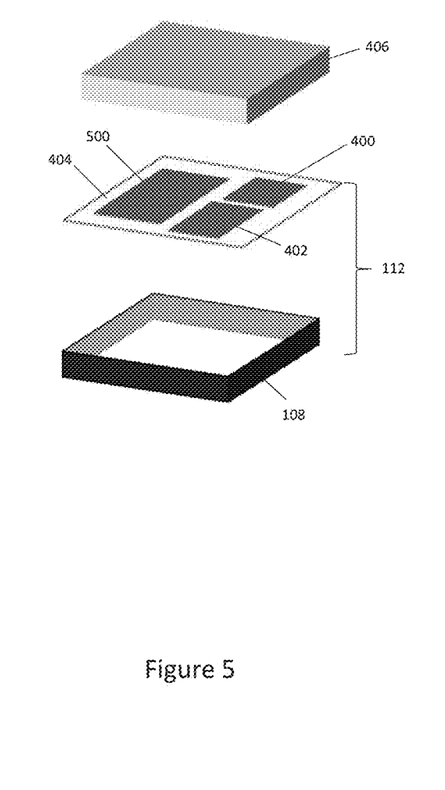

FIG. 5 shows an exploded side perspective view of the power device module 112, according to another embodiment. The embodiment shown in FIG. 5 is similar to the embodiment shown in FIG. 4 in that the power device module 112 implements a single phase of a power converter or voltage regulator that converts the intermediate voltage V_int output by the power converter 104 attached to the system board 102 to a voltage that is within the operating range of the processor 106 and below the voltage limit of the processor substrate 108. Different, however, the power device module 112 in FIG. 5 further includes circuitry 500 at least for driving the high-side power transistor chip 400 and the low-side power transistor chip 402 of the singe phase. The circuitry 500 may also include the control circuitry such as a pulse width modulator (PWM) and related circuits needed for controlling the single phase as a power converter or voltage regulator. The capacitors 410 which form part of the single phase are not shown as being embedded within the processor substrate 108 in this embodiment.

Figure 6:
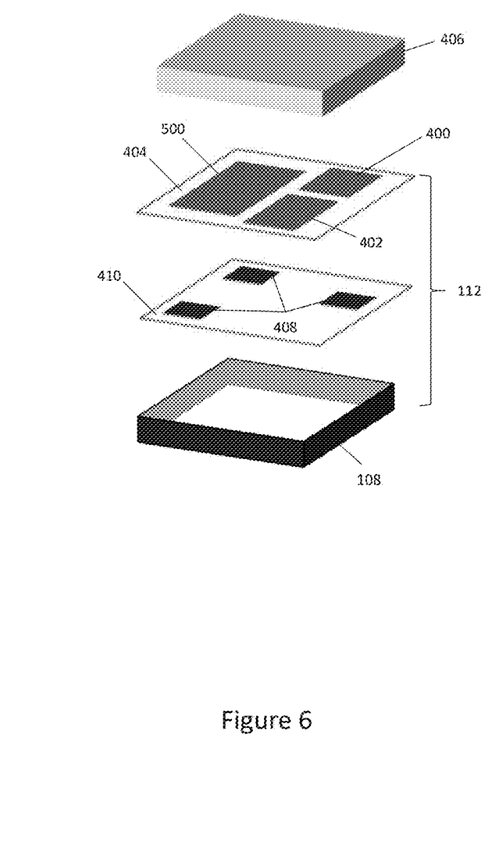

FIG. 6 shows an exploded side perspective view of the power device module 112, according to another embodiment. The embodiment shown in FIG. 6 is similar to the embodiment shown in FIG. 5. Different, however, the capacitors 410 which form part of the single phase are embedded within the processor substrate 108 in FIG. 6.

Figure 7:
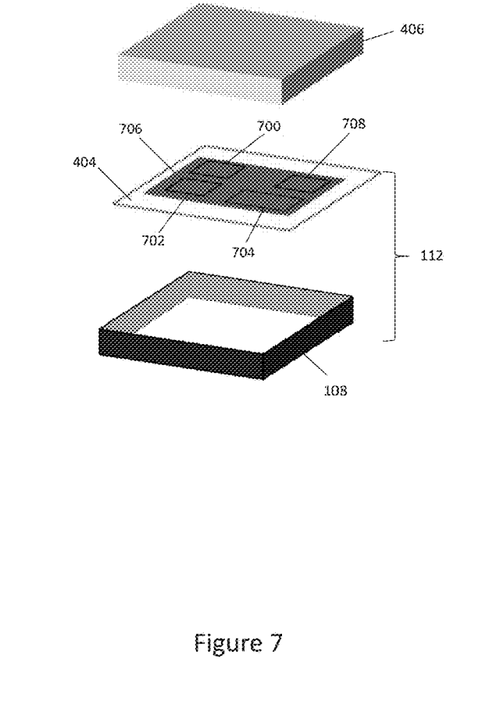

FIG. 7 shows an exploded side perspective view of the power device module 112, according to another embodiment. According to this embodiment, the high-side power transistor 700, low-side power transistor 702 and driver and/or control circuitry 704 that form a single phase power converter or voltage regulator that converts the intermediate voltage V_int output by the power converter 104 attached to the system board 102 to a voltage that is within the operating range of the processor 106 and below the voltage limit of the processor substrate 108 are integrated in the same die 706. The capacitance 708 for the single phase may also be integrated in the same die 706 that includes the high-side power transistor 700, low-side power transistor 702 and driver and/or control circuitry 704. If the circuitry 704 includes both the driver and control circuitry for implementing a single phase power converter or voltage regulator, the entire power converter/voltage regulator is embedded in the processor substrate 108 except for the output inductor 408, which may also be embedded in the processor substrate 108.

Figure 8:
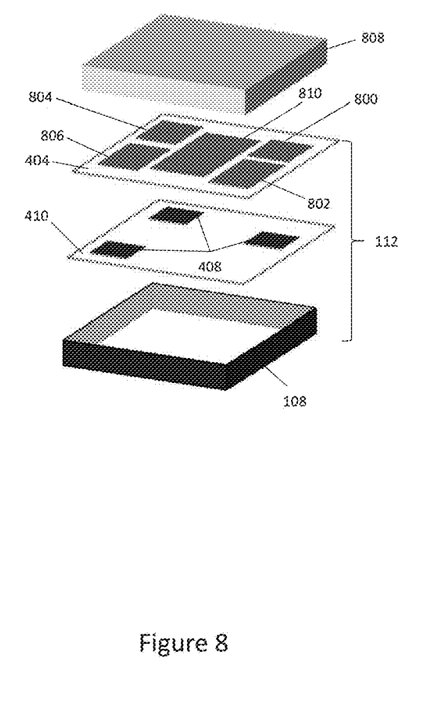

FIG. 8 shows an exploded side perspective view of the power device module 112, according to another embodiment. According to this embodiment, the power device module 112 implements a 2-phase power converter or voltage regulator that converts the intermediate voltage V_int output by the power converter 104 attached to the system board 102 to a voltage that is within the operating range of the processor 106 and below the voltage limit of the processor substrate 108. A first pair of high-side and low-side power transistor chips 800, 802 form a first phase of the 2-phase power converter or voltage regulator, and a first pair of high-side and low-side power transistor chips 804, 806 form a second phase of the 2-phase power converter or voltage regulator.

In the case of a buck converter, the first pair of high-side and low-side power transistor chips 800, 802 are electrically connected in a half-bridge configuration at a first switch node which is electrically connected to a first winding wound on a common core of a coupled inductor 808 to form the first phase of the 2-phase power converter or voltage regulator. Likewise, the second pair of high-side and low-side power transistor chips 804, 806 are electrically connected in a half-bridge configuration at a second switch node which is electrically connected to a second winding wound on the common core of the coupled inductor 808 to form the second phase of the 2-phase power converter or voltage regulator. Capacitors 410 which form part of the 2-phase power converter or voltage regulator may also be embedded in another layer 412 of the electrically insulating material 118 of the processor substrate 108.

The embodiment shown in FIG. 8 also includes circuitry 810 at least for driving the first pair of high-side and low-side power transistor chips 800, 802 of the first phase and the second pair of high-side and low-side power transistor chips 804, 806 of the second phase. The circuitry 810 may also include the control circuitry such as a pulse width modulator (PWM) and related circuits needed for controlling both phases as a 2-phase power converter or voltage regulator. The 2-phase implementation shown in FIG. 8 may be extended to implement an n-phase power converter or voltage regulator where n is a positive integer greater than or equal to 2.

Figure 9:
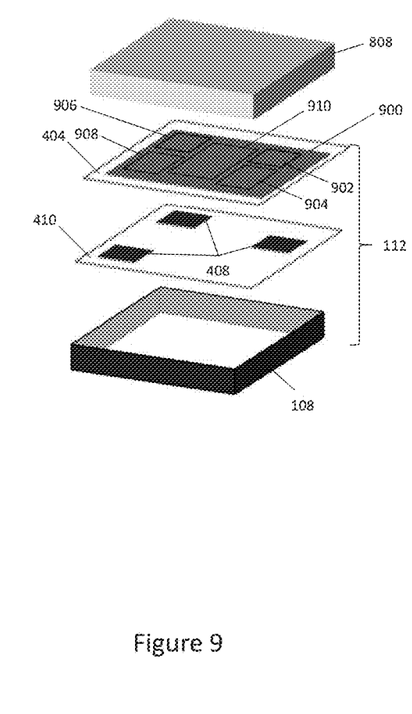

FIG. 9 shows an exploded side perspective view of the power device module 112, according to another embodiment. The embodiment shown in FIG. 9 is similar to the embodiment shown in FIG. 8. Different, however, the power transistors and related driver and/or control circuitry are monolithically in a single chip 900 to yield a multi-phase power converter/voltage regulator that converts the intermediate voltage V_int output by the power converter 104 attached to the system board 102 to a voltage that is within the operating range of the processor 106 and below the voltage limit of the processor substrate 108. According to this embodiment, the first pair of high-side and low-side power transistors 902, 904 which implement the first phase of the power converter/voltage regulator, the second pair of high-side and low-side power transistors 906, 908 which implement the second phase of the power converter/voltage regulator, and the corresponding driver and/or control circuitry 910 are integrated in the same die 900. If the circuitry 910 integrated in the die 900 includes both the driver and control circuitry for implementing a multi-phase power converter or voltage regulator, the entire power converter/voltage regulator is embedded in the processor substrate 108 except for the coupled inductor 808, which may also be embedded in the processor substrate 108. Instead of a coupled inductor 808, each phase of the multi-phase power converter or voltage regulator may use a separate coupled inductor not wound on a common core and each of which may or may not be embedded in the processor substrate 108.

Although the present disclosure is not so limited, the following numbered examples demonstrate one or more aspects of the disclosure.

Example 1. An electronic system, comprising: a board; a power converter attached to the board and configured to convert an input voltage applied to the board to an intermediate voltage; and a processor attached to a substrate, wherein the substrate is attached to the board or seated in a socket attached to the board, wherein the substrate comprises: an electrically insulating material having a first main side facing the processor and a second main side facing the board; a plurality of electrically conductive structures embedded in the electrically insulating material and configured to provide an electrical interface between the processor and the board if the substrate is attached to the board, or between the processor and the socket if the substrate is seated in the socket; and a power device module embedded in the electrically insulating material and configured to convert the intermediate voltage at the second main side to a voltage that is within an operating range of the processor and below a voltage limit of the substrate.

Example 2. The electronic system of example 1, wherein the electrically insulating material of the substrate is an organic material.

Example 3. The electronic system of examples 1 or 2, wherein the power device module comprises at least one power switch embedded in the electrically insulating material.

Example 4. The electronic system of example 3, wherein the power device module further comprises a driver circuit embedded in the electrically insulating material and configured to drive the at least one power switch.

Example 5. The electronic system of example 4, wherein the power device module further comprises a controller embedded in the electrically insulating material and configured to control the driver circuit so as to implement a power converter or a voltage regulator configured to convert the intermediate voltage to a voltage that is within the operating range of the processor and below the voltage limit of the substrate.

Example 6. The electronic system of example 5, wherein the voltage regulator is a multi-phase voltage regulator, and wherein a pair of power switches coupled in a half-bridge configuration is embedded in the electrically insulating material for each phase of the multi-phase voltage regulator.

Example 7. The electronic system of example 6, wherein the power device module further comprises one or more capacitors and/or an inductor embedded in the electrically insulating material for each phase of the multi-phase voltage regulator.

Example 8. The electronic system of example of claim 7, wherein the inductor for each phase of the multi-phase voltage regulator is a separate winding wound on a common core.

Example 9. The electronic system of any of examples 1 through 8, wherein the processor is configured to control the driver circuit of the power device module so as to implement a power converter or a voltage regulator.

Example 10. The electronic system of example 9, wherein the electrical interface provided by the substrate includes a first connection configured to receive a switching control signal from the processor for controlling the driver circuit included in the power device module, and one or more second connections configured to provide telemetry data from the power device module to the processor.

Example 11. The electronic system of any of examples 1 through 10, wherein the power device module is vertically aligned with the processer, and wherein a primary current path between the board, the socket, the substrate and the processor is a vertical path which includes the power device module.

Example 12. A processor substrate, comprising: an electrically insulating material having a first main side and a second main side opposite the first main side; a plurality of electrically conductive structures embedded in the electrically insulating material and configured to provide an electrical interface for a processor at the first main side of the electrically insulating material and to provide electrical connections from the electrical interface to the second main side of the electrically insulating material; and a power device module embedded in the electrically insulating material and configured to convert a voltage provided at the second main side of the electrically insulating material and which exceeds a voltage limit of the processor substrate to a voltage that is within an operating range of the processor and below the voltage limit of the processor substrate.

Example 13. The processor substrate of example 12, wherein the electrically insulating material is an organic material.

Example 14. The processor substrate of examples 12 or 13, wherein the power device module comprises at least one power switch embedded in the electrically insulating material.

Example 15. The processor substrate of example 14, wherein the power device module further comprises a driver circuit embedded in the electrically insulating material and configured to drive the at least one power switch.

Example 16. The processor substrate of example 15, wherein the power device module further comprises a controller embedded in the electrically insulating material and configured to control the driver circuit so as to implement a power converter or a voltage regulator.

Example 17. The processor substrate of example 16, wherein the voltage regulator is a multi-phase voltage regulator, and wherein a pair of power switches coupled in a half-bridge configuration is embedded in the electrically insulating material for each phase of the multi-phase voltage regulator.

Example 18. The processor substrate of example 17, wherein the power device module further comprises one or more capacitors and an inductor for each phase of the multi-phase voltage regulator embedded in the electrically insulating material.

Example 19. The processor substrate of example 18, wherein the inductor for each phase of the multi-phase voltage regulator is a separate winding wound on a common core.

Example 20. The processor substrate of any of examples 12 through 19, wherein the electrical interface includes a first connection configured to receive a switching control signal from the processor for controlling the driver circuit included in the power device module, and one or more second connections configured to provide telemetry data from the power device module to the processor.

Example 21. The processor substrate of any of examples 12 through 20, wherein the electrically insulating material comprises a first layer in which the power device module is embedded and at least one additional layer formed on the first layer, wherein the power device module has at least one contact configured to receive the voltage provided at the second main side of the electrically insulating material, and wherein the plurality of electrically conductive structures embedded in the electrically insulating material includes distribution circuitry configured to carry the voltage provided by the power device module to the first main side of the electrically insulating material.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic system, comprising:
a board;
a power converter attached to the board and configured to convert an input voltage applied to the board to an intermediate voltage; and
a processor attached to a substrate,
wherein the substrate is attached to the board or seated in a socket attached to the board,
wherein the substrate comprises:
an electrically insulating material having a first main side facing the processor and a second main side facing the board;
a plurality of electrically conductive structures embedded in the electrically insulating material and configured to provide an electrical interface between the processor and the board if the substrate is attached to the board, or between the processor and the socket if the substrate is seated in the socket; and
a power device module embedded in the electrically insulating material and configured to convert the intermediate voltage at the second main side to a voltage that is within an operating range of the processor and below a voltage limit of the substrate.

2. The electronic system of claim 1, wherein the electrically insulating material of the substrate is an organic material.

3. The electronic system of claim 1, wherein the power device module comprises at least one power switch embedded in the electrically insulating material.

4. The electronic system of claim 3, wherein the power device module further comprises a driver circuit embedded in the electrically insulating material and configured to drive the at least one power switch.

5. The electronic system of claim 4, wherein the power device module further comprises a controller embedded in the electrically insulating material and configured to control the driver circuit so as to implement a power converter or a voltage regulator configured to convert the intermediate voltage to a voltage that is within the operating range of the processor and below the voltage limit of the substrate.

6. The electronic system of claim 5, wherein the voltage regulator is a multi-phase voltage regulator, and wherein a pair of power switches coupled in a half-bridge configuration is embedded in the electrically insulating material for each phase of the multi-phase voltage regulator.

7. The electronic system of claim 6, wherein the power device module further comprises one or more capacitors and/or an inductor embedded in the electrically insulating material for each phase of the multi-phase voltage regulator.

8. The electronic system of claim 7, wherein the inductor for each phase of the multi-phase voltage regulator is a separate winding wound on a common core.

9. The electronic system of claim 4, wherein the processor is configured to control the driver circuit of the power device module so as to implement a power converter or a voltage regulator.

10. The electronic system of claim 9, wherein the electrical interface provided by the substrate includes a first connection configured to receive a switching control signal from the processor for controlling the driver circuit included in the power device module, and one or more second connections configured to provide telemetry data from the power device module to the processor.

11. The electronic system of claim 1, wherein the power device module is vertically aligned with the processor, and wherein a primary current path between the board, the socket, the substrate and the processor is a vertical path which includes the power device module.

12. A processor substrate, comprising:
an electrically insulating material having a first main side and a second main side opposite the first main side;
a plurality of electrically conductive structures embedded in the electrically insulating material and configured to provide an electrical interface for a processor at the first main side of the electrically insulating material and to provide electrical connections from the electrical interface to the second main side of the electrically insulating material; and
a power device module embedded in the electrically insulating material and configured to convert a voltage provided at the second main side of the electrically insulating material and which exceeds a voltage limit of the processor substrate to a voltage that is within an operating range of the processor and below the voltage limit of the processor substrate.

13. The processor substrate of claim 12, wherein the electrically insulating material is an organic material.

14. The processor substrate of claim 12, wherein the power device module comprises at least one power switch embedded in the electrically insulating material.

15. The processor substrate of claim 14, wherein the power device module further comprises a driver circuit embedded in the electrically insulating material and configured to drive the at least one power switch.

16. The processor substrate of claim 15, wherein the power device module further comprises a controller embedded in the electrically insulating material and configured to control the driver circuit so as to implement a power converter or a voltage regulator.

17. The processor substrate of claim 16, wherein the voltage regulator is a multi-phase voltage regulator, and wherein a pair of power switches coupled in a half-bridge configuration is embedded in the electrically insulating material for each phase of the multi-phase voltage regulator.

18. The processor substrate of claim 17, wherein the power device module further comprises one or more capacitors and an inductor for each phase of the multi-phase voltage regulator embedded in the electrically insulating material.

19. The processor substrate of claim 15, wherein the electrical interface includes a first connection configured to receive a switching control signal from the processor for controlling the driver circuit included in the power device module, and one or more second connections configured to provide telemetry data from the power device module to the processor.

20. The processor substrate of claim 12, wherein the electrically insulating material comprises a first layer in which the power device module is embedded and at least one additional layer formed on the first layer, wherein the power device module has at least one contact configured to receive the voltage provided at the second main side of the electrically insulating material, and wherein the plurality of electrically conductive structures embedded in the electrically insulating material includes distribution circuitry configured to carry the voltage provided by the power device module to the first main side of the electrically insulating material.

* * * * *